United States Patent

Peale

Patent Number: 6,013,540
Date of Patent: Jan. 11, 2000

[54] LASER DIODE WITH SUBSTRATE-SIDE PROTECTION

[75] Inventor: David Reese Peale, Chatham, N.J.

[73] Assignee: Lucent Technologies, Inc., Murray Hill, N.J.

[21] Appl. No.: 09/071,503

[22] Filed: May 1, 1998

[51] Int. Cl.⁷ .................................................. H01L 21/302
[52] U.S. Cl. ............................................. 438/33; 438/462
[58] Field of Search ................................ 438/460, 33, 38, 438/28, 29, 110, 113, 114, 778, 779, 787, 791, 902, 928, 958, 465, FOR 287, FOR 289; 372/49

[56] References Cited

U.S. PATENT DOCUMENTS

| | | | |
|---|---|---|---|
| 4,040,877 | 8/1977 | Johnson et al. | 438/465 |
| 4,217,689 | 8/1980 | Fujii et al. | 438/465 |
| 4,822,755 | 4/1989 | Hawkins et al. | 438/465 |
| 4,961,821 | 10/1990 | Drake et al. | 438/460 |
| 5,040,044 | 8/1991 | Noguchi et al. | 438/779 |
| 5,063,173 | 11/1991 | Gasser et al. | 438/33 |
| 5,094,970 | 3/1992 | Yoshida et al. | 438/33 |
| 5,430,750 | 7/1995 | Tanimoto et al. | 372/49 |
| 5,459,106 | 10/1995 | Yamada et al. | 438/38 |
| 5,629,233 | 5/1997 | Chand et al. | 438/33 |
| 5,665,637 | 9/1997 | Chand . | |
| 5,668,049 | 9/1997 | Chakrabarti et al. | 438/33 |

Primary Examiner—Savitri Mulpuri

[57] ABSTRACT

A semiconductor optical device is formed to include a substrate-side dielectric barrier layer in the area where the substrate and facet meet. The dielectric is deposited on the substrate surface prior to cleaving of the facet and results in reducing the defects along the facet. The dielectric material also serves as a substrate-side "anchor" for the dielectric deposited on the facet, reducing the incidence of delamination of the dielectric coating from the facet.

7 Claims, 1 Drawing Sheet

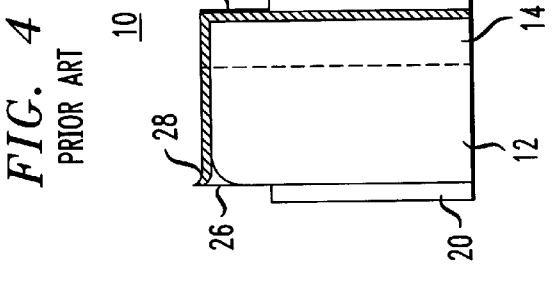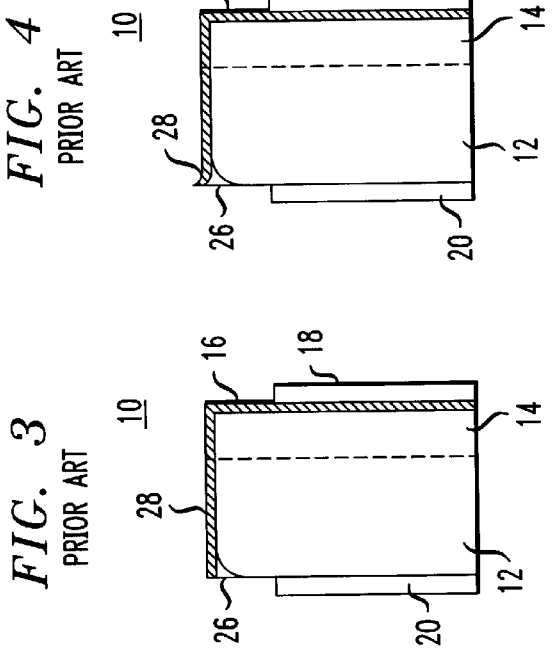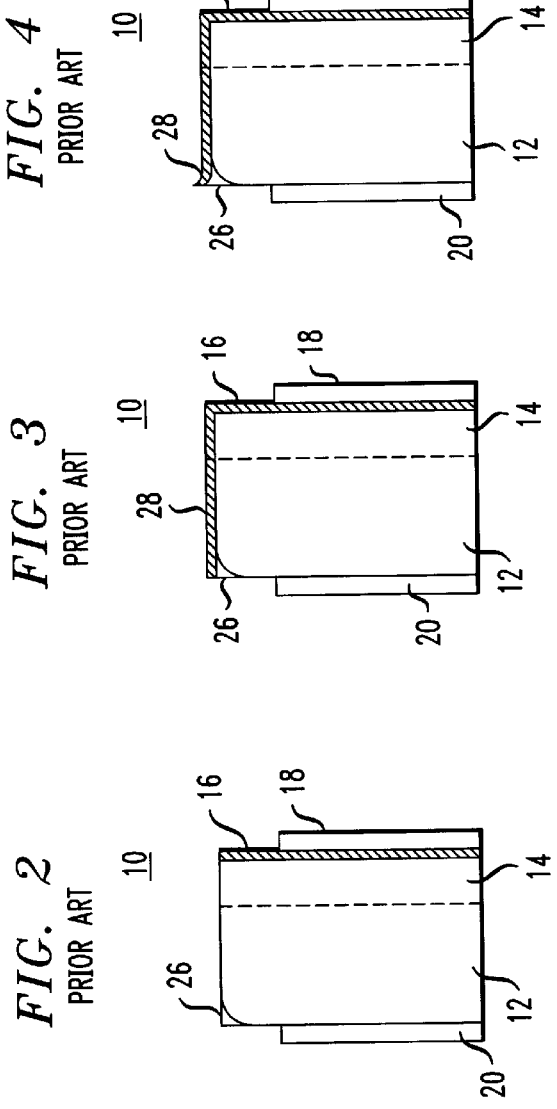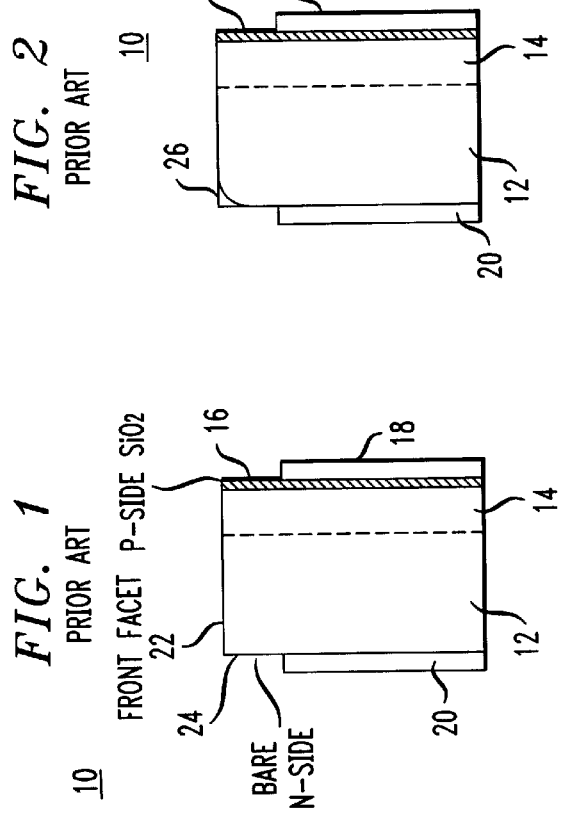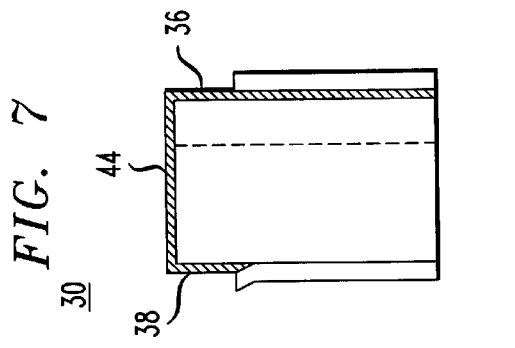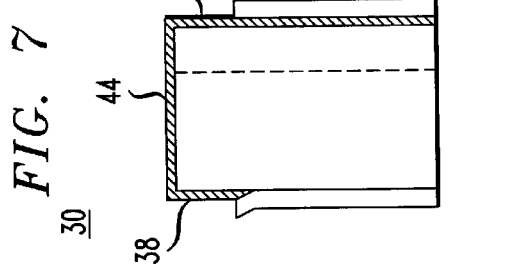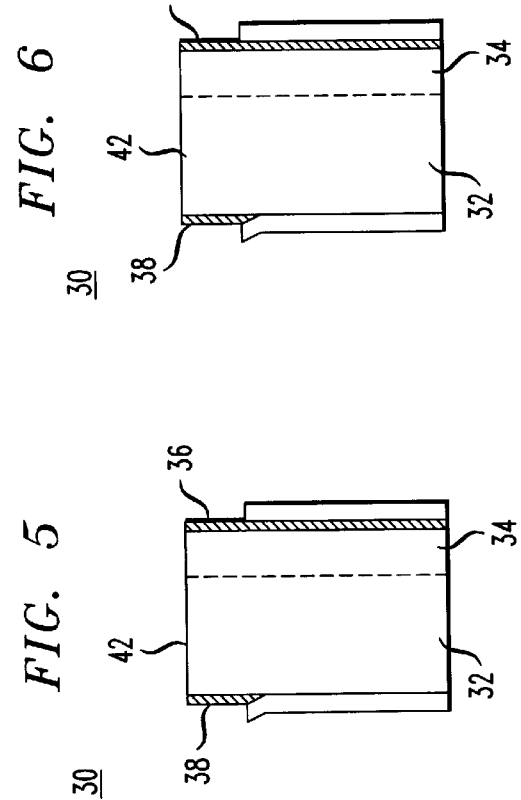

LASER DIODE WITH SUBSTRATE-SIDE PROTECTION

BACKGROUND OF THE INVENTION

The present invention relates to a laser diode including a substrate-side protection layer and, more particularly, to the inclusion of a dielectric barrier region on the substrate side of a semiconductor laser diode to reduce facet degradation and improve facet coating, as well as the environmental durability of the laser structure.

Conventional semiconductor laser diodes and superluminant diodes comprise an epitaxial layer grown over a substrate. In most conventional arrangements, the substrate is of N-type conductivity and the epitaxial is of P-type conductivity, although a complementary structure may also be formed. The diode device, while still in wafer form, is cleaved to form laser bars that include front and rear facets. These facets are subsequently coated to define the cavity of the diode. A dielectric layer is deposited over the epitaxial side of the device to ensure that current from the contact pad is injected into only the active stripe formed within the structure.

In forming the final device, the front and rear facets are coated (with either a high reflectivity (HR) coating or an anti-reflective (AR) coating, as appropriate). As currently processed, there may be vulnerable points in the integrity of the facet coating that result from contamination and oxidation present along the edge where the facet, or face, meets the substrate surface. As a result, the facet coating can be poorly anchored at the substrate edge and may, under certain circumstances, result in degradation of the facet/coating interface. Further, once the degradation process begins, the facet coating may begin to delaminate, eventually resulting in failure of the device, or the system containing the device.

Thus, a need remains in the art for a method of eliminating diode device failure associated with substrate-side contamination effects.

SUMMARY OF THE INVENTION

The need remaining in the prior art is addressed by the present invention, which relates to a laser diode including a substrate-side protection layer and, more particularly, to the inclusion of a dielectric barrier region on the substrate side of a semiconductor laser diode to reduce facet degradation and improve facet coating.

In accordance with the present invention, a dielectric layer is deposited on the exposed surface region of the substrate prior to facet cleaving. The inclusion of the dielectric layer serves to reduce microscopic damage during the facet cleaving operation, resulting in a cleaner and less defective facet. The thickness of the dielectric layer helps to prevent contamination from the bottom of the wafer reaching the chemically-sensitive substrate surface. In addition, the presence of the dielectric helps limit the spatial extent of oxidation at the substrate/facet corner.

A feature of the structure of the present invention is that the substrate-side dielectric layer is used as an anchoring for subsequent facet dielectric coating, reducing delamination problems associated with the prior art structures.

Other and further features of the present invention will become apparent during the course of the following discussion and by reference to the accompanying drawings.

BRIEF DESCRIPTION OF THE INVENTION

Referring now to the drawings, where like numerals represent like parts in several views:

FIGS. 1–4 illustrate an exemplary prior art process of facet coating as used in the production of diode lasers and superluminant diodes; and FIGS. 5–7 illustrate process steps of the present invention that include the formation of a substrate-side dielectric layer.

DETAILED DESCRIPTION

A conventional prior art processing sequence for forming laser diodes is illustrated in FIGS. 1–4. It is to be understood that there are many other steps involved in the complete fabrication of a semiconductor optical device (either a laser or superluminant diode) and that the process discussed below relates only to a subset of these steps, where the particular steps described below are useful in understanding the potential contamination/delamination problem present in prior art diode structures. Referring to the drawings, FIG. 1 is a side view of a laser device 10 includes a substrate region 12 and an epitaxial layer 14 formed to cover the top major surface of substrate region 12. In most conventional device structures, the substrate region is doped to comprise N-type conductivity and the epitaxial side is doped to exhibit P-type conductivity. Therefore, during the course of the following discussion the substrate may be referred to as the "N-side" and the epitaxial layer as the "P-side". It is to be understood that these definitions are for the purposes of discussion only, and that a complementary device structure (P-type substrate and N-type epitaxial layer) may also be formed and use the substrate coating technique of the present invention.

Referring back to FIG. 1, a dielectric layer 16 is next formed to cover the exposed surface of P-side 14. Silicon dioxide is commonly used for dielectric layer 16 and may be deposited using a plasma CVD process. Other dielectric materials, for example, silicon nitride or aluminum oxide, may also be used in the process of the present invention. Layer 16 is used as an insulating layer for device 10 and ensures that current from a P-side contact pad 18 is injected only into the active stripe of the laser. An N-side contact pad 20 is also shown in FIG. 1. Front facet 22 of device 10 is usually formed by resting N-side 12 on a support structure and mechanically cleaving the device. During the cleaving operation, therefore, N-side corner 24 will be subject to contamination and possible damage. In fact, the cleaving operation may result in a significant number of atomic step edges being formed in the facet crystal plane near corner 24. It is well known in the field of surface science that the chemical reactivity of atomic step edges (as are present at corner 24) is much higher than that of a defect-free low index atomic plane. The presence of these additional steps thus provides for a significant number of surface defects that may be readily oxidized during an evaporator pre-bake step. FIG. 2 illustrates device 10 subsequent to such an evaporator pre-bake process. As shown, corner 24 has oxidized significantly more than the planar substrate and facet surface, and an oxide region 26 has formed.

The next step in the fabrication process is the deposition of a dielectric facet coating layer 28 over facet 22. FIG. 3 illustrates device 10 after the deposition process. Subsequent to the facet coating step, device 10 may be subject to additional chemical and mechanical processes. Not only are the sites at these step edges more reactive in an individual atomic reaction, but for larger steps, the different surface potentials of the different crystal planes produced at step bunches drive electrochemical cyclic corrosion reactions in the presence of oxygen and a suitable ionic electrolyte (usually adsorbed moisture). Therefore, these atomic steps (as well as larger step bunches) promote degradation of facet 22, which in turn compromises the adhesion of facet coating layer 28 over the affected area. As a result, facet coating layer 28 can become poorly anchored in region 26, where these atomic step edges are concentrated. Environmental factors in a non-hermetically packaged device may lead to further degradation of the device/coating interface, starting at region 26. Once started, the degradation can propagate quickly under coating layer 28, causing delamination of layer 28, as illustrated in FIG. 4, and eventual failure of device 10.

These and other problems are addressed by the device structure of the present invention, as illustrated by the processing steps of FIGS. 5–7. Referring to FIG. 5, a device 30 is shown as comprising a substrate ("N-side") 32, with an epitaxial layer 34 ("P-side") grown to cover the top major surface. As with the prior art process described above, a dielectric layer 36 is deposited to cover and insulate the exposed surface of P-side 36. Dielectric layer 36 may comprise $SiO_2$ or any other suitable insulating material (including, but not limited to, $Si_3N_4$ or $Al_2O_3$). In a preferred processing sequence, layer 36 may be deposited using a chemical vapor deposition (CVD) process.

In accordance with the present invention, a dielectric protection layer 38 is also deposited to cover the exposed portion of N-side 32. In one exemplary process, layers 36 and 38 may be formed simultaneously. Separate deposition processes may also be used. As device 30 is cleaved to form facet 42, therefore, dielectric region 38 will protect N-side 32 from contamination and the formation of atomic step edges. Thus, oxidation of the corner region will be inhibited during the evaporator pre-bake, as shown in FIG. 6.

Advantageously, the formation of dielectric region 38 provides a strong anchoring point during the deposition of facet coating layer 44, as shown in FIG. 7. That is, the edges of coating layer 44 are now chemically and mechanically secured to dielectric region 38 on the N-side and dielectric layer 36 on the P-side. Therefore, facet coating layer 44 is less prone to delamination, since N-side dielectric region 38 is tightly bound to the N-side surface of device 30. Moreover, this bond between facet dielectric 44 and N-side dielectric 38 effectively seals facet 42 from environmental influences that attempt to penetrate from both the N and P edges. Therefore, the inclusion of the N-side dielectric helps maintain the integrity of the facet/coating interface and deters delamination of coating layer 44.

It is to be understood that various other insulating materials (such as, for example, $Si_3N_4$ or $Al_2O_3$) may be used to form either insulating layer and, additionally, deposition processes other than chemical vapor deposition may be used to form the insulating layers on the surfaces of the device, while remaining within the spirit and scope of the present invention as defined by the claims appended hereto.

What is claimed is:

1. In the fabrication of a semiconductor optical device, a method of reducing facet degradation, the method comprising the steps of:

a) providing a semiconductor optical device structure including a substrate of a first conductivity type with an epitaxial layer of a second conductivity type disposed to cover a top major surface of said substrate;

b) depositing a dielectric layer over the exposed surface of said epitaxial layer;

c) depositing a dielectric layer over the exposed surface of said substrate wherein during subsequent cleaving of said device to form a facet, the facet edges are protected by the presence of said substrate dielectric layer;

d) cleaving the semiconductor optical device structure to form facet surfaces normal to the substrate and epitaxial layer; and e) depositing a dielectric coating on a facet surface, said dielectric coating being mechanically and chemically connected to the dielectric coatings on said epitaxial layer and said substrate.

2. The method as defined in claim 1 wherein in performing steps b) and c), silicon dioxide is deposited.

3. The method as defined in claim 1 wherein in performing steps b) and c), silicon nitride is deposited.

4. The method as defined in claim 1 wherein in performing steps b) and c), aluminum oxide is deposited.

5. The method as defined in claim 1 wherein in performing steps b) and c), a chemical vapor deposition process is used.

6. The method as defined in claim 1 wherein steps b) and c) are performed simultaneously.

7. The method as defined in claim 1 wherein steps b) and c) are performed sequentially.

* * * * *